United States Patent
Ito et al.

(10) Patent No.: US 8,694,861 B2
(45) Date of Patent: *Apr. 8, 2014

(54) MEMORY DEVICE REPAIR APPARATUS, SYSTEMS, AND METHODS

(75) Inventors: Yutaka Ito, Tokyo (JP); Adrian J. Drexler, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/593,217

(22) Filed: Aug. 23, 2012

(65) Prior Publication Data

US 2012/0324298 A1 Dec. 20, 2012

Related U.S. Application Data

(63) Continuation of application No. 12/049,036, filed on Mar. 14, 2008, now Pat. No. 8,255,771.

(51) Int. Cl.
*G11C 29/00* (2006.01)

(52) U.S. Cl.
USPC .......................................... 714/764; 714/763

(58) Field of Classification Search
USPC ............................................. 714/7, 763, 764
See application file for complete search history.

(56) References Cited

U.S. PATENT DOCUMENTS

| | | | |
|---|---|---|---|
| 6,397,365 B1 | 5/2002 | Brewer et al. | |
| 6,532,556 B1 | 3/2003 | Wong et al. | |
| 6,697,992 B2 | 2/2004 | Ito et al. | |
| 7,216,198 B2 | 5/2007 | Ito et al. | |
| 7,219,271 B2 * | 5/2007 | Kleveland et al. | 714/718 |
| 8,255,771 B2 | 8/2012 | Ito et al. | |
| 2002/0196683 A1 * | 12/2002 | Ohtani et al. | 365/200 |
| 2003/0084386 A1 | 5/2003 | Barth, Jr. et al. | |
| 2005/0066226 A1 | 3/2005 | Adams et al. | |
| 2005/0229076 A1 | 10/2005 | Riho et al. | |
| 2007/0061612 A1 * | 3/2007 | Henderson et al. | 714/5 |
| 2007/0141731 A1 * | 6/2007 | Hemink et al. | 438/14 |
| 2007/0150790 A1 | 6/2007 | Gross et al. | |
| 2008/0311684 A1 * | 12/2008 | Tu et al. | 438/4 |
| 2009/0235145 A1 | 9/2009 | Ito et al. | |

OTHER PUBLICATIONS

"Latch (Electronics)—Gated D-Latch", [on-line]. [retrieved Nov. 12, 2007]. Retrieved from the Internet: <URL: http://en.wikipedia.org/wiki/Latch_%28electronics%29#Gated_D-latch>, 3 pgs.

"Logic Gate", [on-line]. [retrieved Nov. 12, 2007]. Retrieved from the Internet: <URL: http://en.wikipedia.org/wiki/Logic_gate>, 9 pgs.

* cited by examiner

*Primary Examiner* — Sam Rizk

(74) *Attorney, Agent, or Firm* — Schwegman, Lundberg & Woessner, P.A.

(57) ABSTRACT

Operations within a memory device to replace one or more selected failing memory cells with one or more repair memory cells and to correct data digits read from other failing memory cells in the memory device.

23 Claims, 9 Drawing Sheets

FIG. 4

| 240 | 241 | 242 | 243 | 244 | 245 | 246 | 247 | 248 | 249 | 250 | 251 | 252 | 253 | 254 | 255 |
|---|---|---|---|---|---|---|---|---|---|---|---|---|---|---|---|
| 224 | 225 | 226 | 227 | 228 | 229 | 230 | 231 | 232 | 233 | 234 | 235 | 236 | 237 | 238 | 239 |
| 208 | 209 | 210 | 211 | 212 | 213 | 214 | 215 | 216 | 217 | 218 | 219 | 220 | 221 | 222 | 223 |
| 192 | 193 | 194 | 195 | 196 | 197 | 198 | 199 | 200 | 201 | 202 | 203 | 204 | 205 | 206 | 207 |
| 176 | 177 | 178 | 179 | 180 | 181 | 182 | 183 | 184 | 185 | 186 | 187 | 188 | 189 | 190 | 191 |
| 160 | 161 | 162 | 163 | 164 | 165 | 166 | 167 | 168 | 169 | 170 | 171 | 172 | 173 | 174 | 175 |
| 144 | 145 | 146 | 147 | 148 | 149 | 150 | 151 | 152 | 153 | 154 | 155 | 156 | 157 | 158 | 159 |
| 128 | 129 | 130 | 131 | 132 | 133 | 134 | 135 | 136 | 137 | 138 | 139 | 140 | 141 | 142 | 143 |
| 112 | 113 | 114 | 115 | 116 | 117 | 118 | 119 | 120 | 121 | 122 | 123 | 124 | 125 | 126 | 127 |
| 96 | 97 | 98 | 99 | 100 | 101 | 102 | 103 | 104 | 105 | 106 | 107 | 108 | 109 | 110 | 111 |
| 80 | 81 | 82 | 83 | 84 | 85 | 86 | 87 | 88 | 89 | 90 | 91 | 92 | 93 | 94 | 95 |
| 64 | 65 | 66 | 67 | 68 | 69 | 70 | 71 | 72 | 73 | 74 | 75 | 76 | 77 | 78 | 79 |
| 48 | 49 | 50 | 51 | 52 | 53 | 54 | 55 | 56 | 57 | 58 | 59 | 60 | 61 | 62 | 63 |
| 32 | 33 | 34 | 35 | 36 | 37 | 38 | 39 | 40 | 41 | 42 | 43 | 44 | 45 | 46 | 47 |
| 16 | 17 | 18 | 19 | 20 | 21 | 22 | 23 | 24 | 25 | 26 | 27 | 28 | 29 | 30 | 31 |
| 0 | 1 | 2 | 3 | 4 | 5 | 6 | 7 | 8 | 9 | 10 | 11 | 12 | 13 | 14 | 15 |

FIG. 5

| 204 | 205 | 206 | 207 | 220 | 221 | 222 | 223 | 236 | 237 | 238 | 239 | 252 | 253 | 254 | 255 |
|---|---|---|---|---|---|---|---|---|---|---|---|---|---|---|---|
| 200 | 201 | 202 | 203 | 216 | 217 | 218 | 219 | 232 | 233 | 234 | 235 | 248 | 249 | 250 | 251 |
| 196 | 197 | 198 | 199 | 212 | 213 | 214 | 215 | 228 | 229 | 230 | 231 | 244 | 245 | 246 | 247 |
| 192 | 193 | 194 | 195 | 208 | 209 | 210 | 211 | 224 | 225 | 226 | 227 | 240 | 241 | 242 | 243 |
| 140 | 141 | 142 | 143 | 156 | 157 | 158 | 159 | 172 | 173 | 174 | 175 | 188 | 189 | 190 | 191 |
| 136 | 137 | 138 | 139 | 152 | 153 | 154 | 155 | 168 | 169 | 170 | 171 | 184 | 185 | 186 | 187 |
| 132 | 133 | 134 | 135 | 148 | 149 | 150 | 151 | 164 | 165 | 166 | 167 | 180 | 181 | 182 | 183 |
| 128 | 129 | 130 | 131 | 144 | 145 | 146 | 147 | 160 | 161 | 162 | 163 | 176 | 177 | 178 | 179 |
| 76 | 77 | 78 | 79 | 92 | 93 | 94 | 95 | 108 | 109 | 110 | 111 | 124 | 125 | 126 | 127 |
| 72 | 73 | 74 | 75 | 88 | 89 | 90 | 91 | 104 | 105 | 106 | 107 | 120 | 121 | 122 | 123 |
| 68 | 69 | 70 | 71 | 84 | 85 | 86 | 87 | 100 | 101 | 102 | 103 | 116 | 117 | 118 | 119 |
| 64 | 65 | 66 | 67 | 80 | 81 | 82 | 83 | 96 | 97 | 98 | 99 | 112 | 113 | 114 | 115 |
| 12 | 13 | 14 | 15 | 28 | 29 | 30 | 31 | 44 | 45 | 46 | 47 | 60 | 61 | 62 | 63 |
| 8 | 9 | 10 | 11 | 24 | 25 | 26 | 27 | 40 | 41 | 42 | 43 | 56 | 57 | 58 | 59 |
| 4 | 5 | 6 | 7 | 20 | 21 | 22 | 23 | 36 | 37 | 38 | 39 | 52 | 53 | 54 | 55 |
| 0 | 1 | 2 | 3 | 16 | 17 | 18 | 19 | 32 | 33 | 34 | 35 | 48 | 49 | 50 | 51 |

US 8,694,861 B2

MEMORY DEVICE REPAIR APPARATUS, SYSTEMS, AND METHODS

PRIORITY APPLICATION

This application is a continuation of U.S. Pat. No. 8,255,771 application Ser. No. 12/049,036, filed Mar. 14, 2008, which is incorporated herein by reference in its entirety.

BACKGROUND

Data digits may be stored in a memory device, and errors may occur when the data is stored or retrieved, or the values may change while the memory device is holding the data digits. An error correcting code (ECC) is used to identify and/or correct errors in the data before it is passed on from the device for its intended purpose. Encoder/decoder (CODEC) circuits implement an ECC in a memory device to identify and/or correct errors in data.

BRIEF DESCRIPTION OF DRAWINGS

FIG. 4 is a map of memory cells according to an embodiment of the invention.

FIG. 5 is a map of memory cells according to an embodiment of the invention.

DETAILED DESCRIPTION

The inventor has discovered that it is advantageous to replace one or more selected failing memory cells in a memory device with one or more repair memory cells and to correct data digits read from other failing memory cells in the memory device using a different method. For example, an error correcting code can be used to correct data read from failing memory cells that are not replaced with a repair memory cell. A memory cell fails if a value stored in the memory cell changes over time. A failing memory cell can be identified by writing a value to the memory cell and then reading a value from the memory cell at a later time to determine if the value in the memory cell changed.

A data digit is an item of data that has one of two or more values. A binary data digit, also called a data bit, has one of two values, a logical one (1) or a logical zero (0). A non-binary data digit has one of three or more values. The following description refers to data digits, and embodiments of the invention described herein may be implemented with data digits or data bits.

Figure 1:
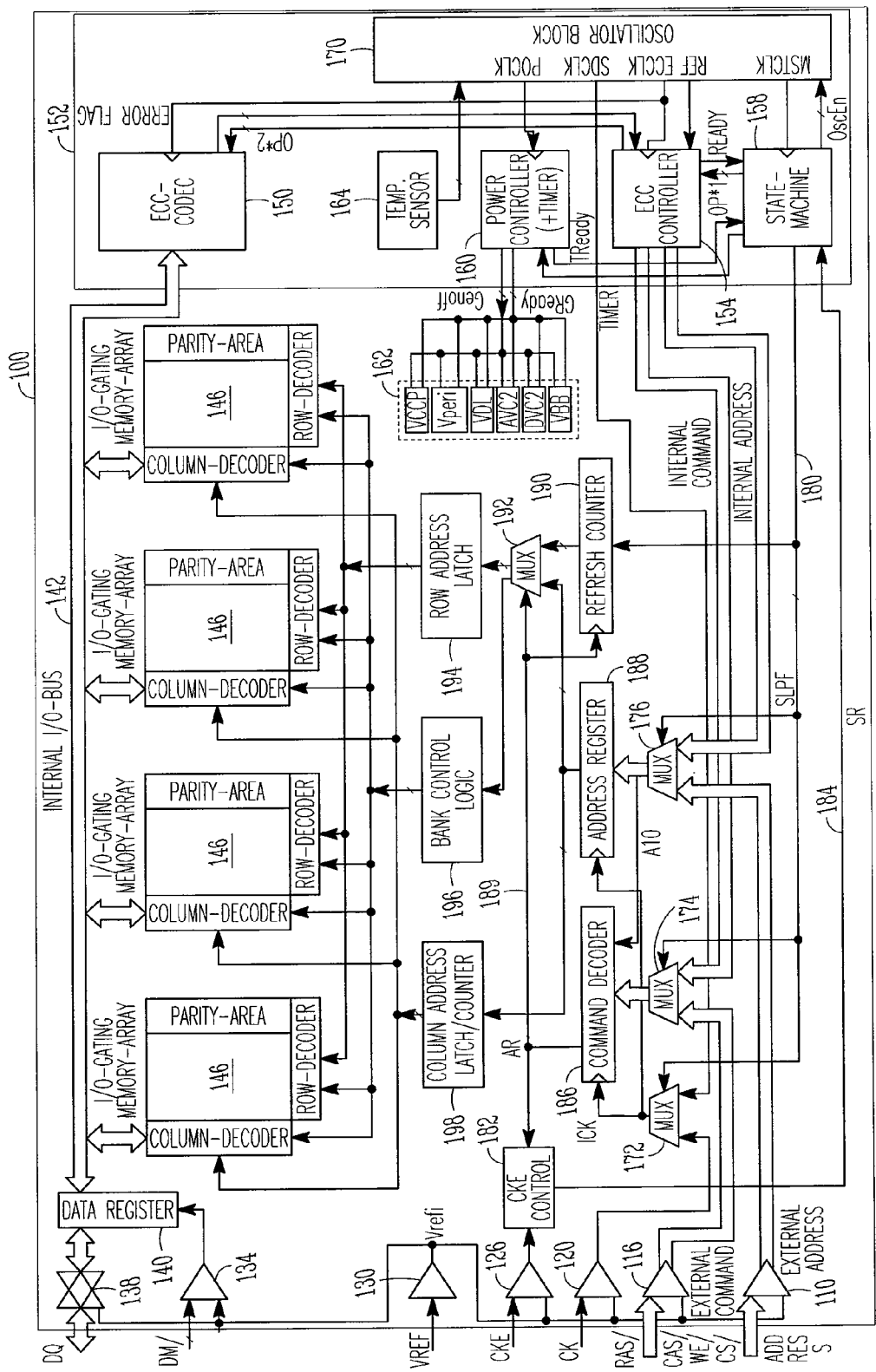
FIG. 1 is a block diagram of a memory device according to an embodiment of the invention.

FIG. 1 is a block diagram of a memory device 100 according to an embodiment of the invention. According to some embodiments, the memory device 100 is a synchronous dynamic random access memory (SDRAM).

The memory device 100 receives several types of external signals. External address signals are received in a buffer 110, external command signals RAS/, CAS/, WE/, and CS/ are received in a buffer 116, an external clock signal CK is received in a buffer 120, and a clock enable signal CKE is received in a buffer 126. A reference voltage VREF is received in a buffer 130, and a data mask signal DM/ is received in a buffer 134. Data signals DQ are exchanged across a two way buffer 138 coupled to a data register 140. The signal DM/ is coupled through the buffer 134 to the data register 140 to control the movement of data.

An internal input/output (I/O) bus 142 exchanges data between the data register 140 and a number of arrays 146 of memory cells. Each array 146 includes a column decoder, a row decoder, and an array of memory cells to store data—including a parity area of memory cells to store parity digits. Data is also exchanged from the internal I/O bus 142 with an error correcting code ECC-CODEC circuit 150 in a control circuit block 152. The ECC-CODEC circuit 150 includes multiple ECC-CODEC circuits to identify and/or correct errors in data read from the arrays 146 of memory cells.

Control circuits in the control circuit block 152 control operations of the memory device 100 during the sleep mode of operation. An ECC controller 154 and a state machine 158 are also located in the control circuit block 152. A power controller 160 exchanges control signals with a plurality of internal voltage generators 162. A temperature sensor circuit 164 senses a temperature of the memory device 100 and provides a signal indicating the temperature to an oscillator block 170.

The oscillator block 170 generates clock signals that are coupled to the power controller 160, the ECC controller 154 and the state machine 158. The oscillator block 170 generates an internal clock signal SDCLK that is coupled to an input of a multiplexer 172. A second input of the multiplexer 172 is coupled to receive the external clock signal CK from the buffer 120. The multiplexer 172 generates an internal clock signal ICK to clock operations in the memory device 100. The internal clock signal ICK is derived from the external clock signal CK outside the sleep mode of operation, but is derived from the internal clock signal SDCLK during the sleep mode of operation.

The state machine 158 issues enable signals OscEn to enable the oscillator block 170. The oscillator block 170 generates an internal clock signal ECCLK that is coupled to the ECC controller 154 for decoding operations.

The external command signals RAS/, CAS/, WE/, and CS/ are coupled from the buffer 116 to an input of a multiplexer 174. A second input of the multiplexer 174 is coupled to receive internal command signals generated by the ECC controller 154. External address signals are coupled from the buffer 110 to an input of a multiplexer 176, and a second input of the multiplexer 176 is coupled to receive internal address signals from the ECC controller 154.

The state machine 158 generates a super low power flag signal SLPF on a line 180 that is coupled to the multiplexers 172, 174 and 176 to control them during the sleep mode of operation. "Super" is a term of art and does not reflect a particular voltage level. The signal SLPF is used to control the memory device 100 during the sleep mode of operation. The oscillator block 170 also generates timing signals that are coupled to the power controller 160, the ECC controller 154, and the state machine 158. A clock enable CKE control circuit 182 is coupled to receive the clock enable signal CKE from the buffer 126, and generates a self-refresh (SR) signal to indicate the SR command on a line 184 in response to the clock enable signal CKE. The SR signal on the line 184 is coupled to the state machine 158 that generates the signal SLPF based on the SR signal.

The internal clock signal ICK is coupled from the multiplexer 172 to a command decoder 186 and an address register 188. The multiplexer 172 chooses the source of the internal clock signal ICK based on the signal SLPF on the line 180. The multiplexer 174 couples command signals to the command decoder 186, selecting either the external commands from the buffer 116 or the internal commands from the ECC controller 154 based on the signal SLPF on the line 180. The multiplexer 176 couples address signals to the address register 188, the address signals being either the external address signals from the buffer 110 or the internal address signals from the ECC controller 154 based on the signal SLPF on the line 180.

The command decoder 186 generates an auto refresh command (AR) signal on the line 189 depending on the commands that it receives, and the AR signal is coupled to the clock enable CKE control circuit 182, a refresh counter 190, and a multiplexer 192. The signal SLPF on the line 180 is also coupled to the refresh counter 190, which provides data to the multiplexer 192 that is in turn coupled to a row address latch 194 and a bank control logic circuit 196. The multiplexer 192 is coupled to receive address signals from the address register 188 which are also supplied to a column address latch and counter 198. The row address latch 194, the bank control logic circuit 196, and a column address latch and counter 198 are coupled to provide control signals to the arrays 146.

According to an embodiment of the invention, failing memory cells in the arrays 146 of memory cells are identified, and selected failing memory cells are replaced with repair memory cells. Data read from the remaining failing memory cells that are not replaced are corrected using another method, such as an error correcting code. The failing memory cells are identified during a test of the memory device 100. The selected failing memory cells that are replaced are selected during the test.

Figure 2:
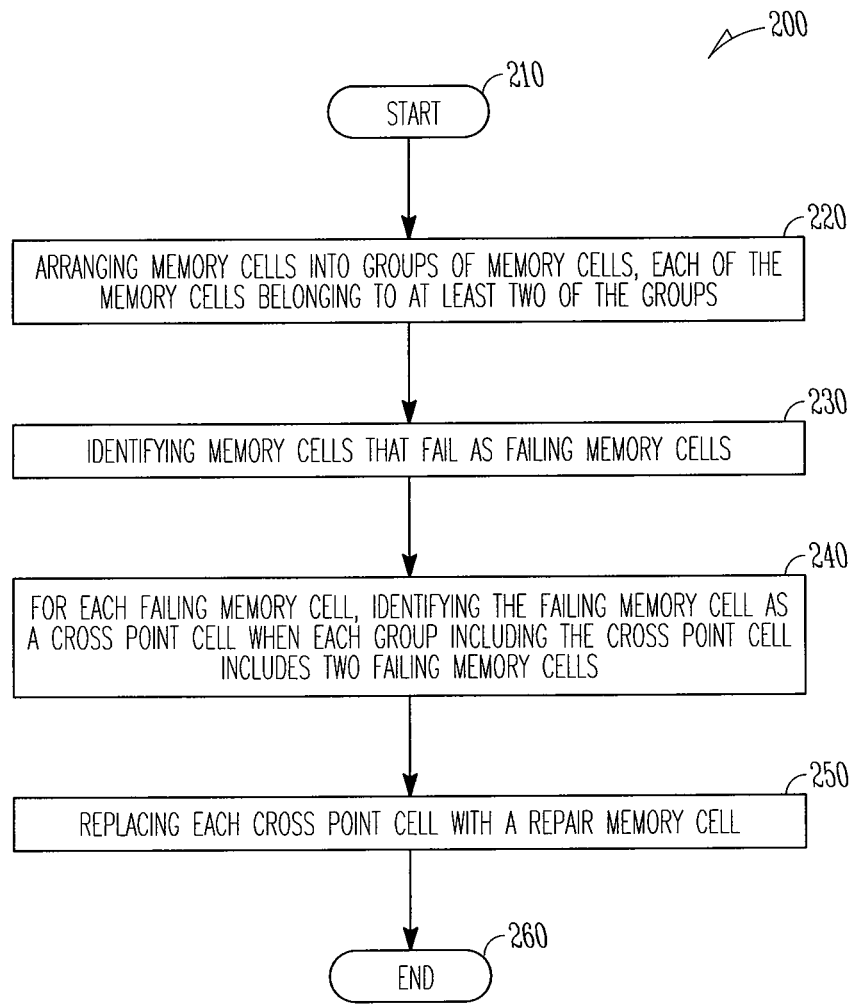
FIG. 2 is a flow diagram of several methods according to an embodiment of the invention.

FIG. 2 is a flow diagram of several methods 200 according to an embodiment of the invention. In activity 210, the methods 200 start. In activity 220, memory cells are arranged into groups of memory cells, each of the memory cells belonging to at least two of the groups. In activity 230, memory cells that fail are identified as failing memory cells. In activity 240, for each failing memory cell, the failing memory cell is identified as a cross point cell when each group including the cross point cell includes two failing memory cells. In activity 250, each cross point cell is replaced with a repair memory cell. In activity 260, the methods 200 end.

Figure 3:
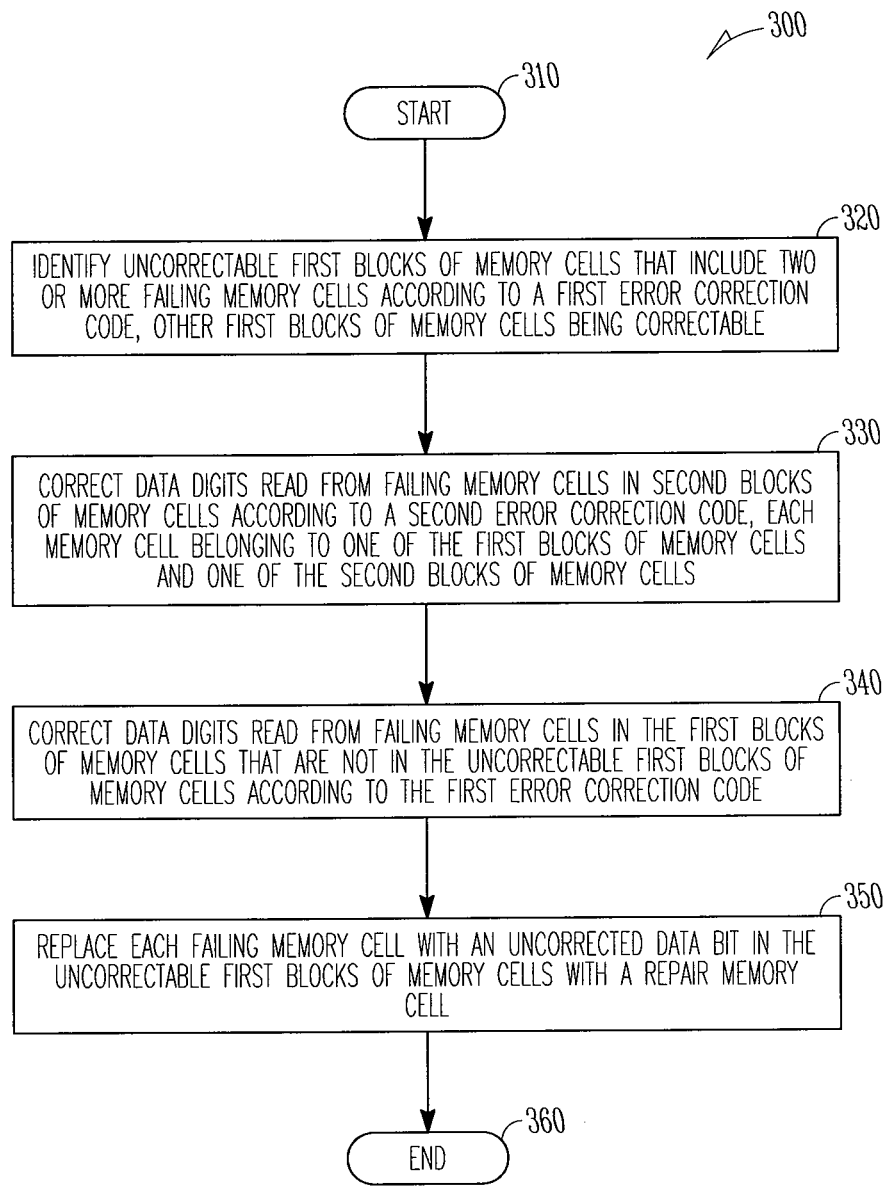
FIG. 3 is a flow diagram of several methods according to an embodiment of the invention.

FIG. 3 is a flow diagram of several methods 300 according to an embodiment of the invention. In activity 310, the methods 300 start. In activity 320, uncorrectable first blocks of memory cells are identified that include two or more failing memory cells according to a first error correction code, other first blocks of memory cells being correctable. In activity 330, data digits read from failing memory cells in second blocks of memory cells are corrected according to a second error correction code, each memory cell belonging to one of the first blocks of memory cells and one of the second blocks of memory cells. The first blocks and the second blocks are in the same array of memory cells. In activity 340, data digits read from failing memory cells in the first blocks of memory cells that are not in the uncorrectable first blocks of memory cells are corrected according to the first error correction code. In activity 350, each failing memory cell with an uncorrected data digit in the uncorrectable first blocks of memory cells is replaced with a repair memory cell. In activity 360, the methods 300 end.

The individual activities of methods 200 and 300 may not have to be performed in the order shown or in any particular order. Some activities may be repeated, and others may occur only once. Some activities may be substituted for other activities, within or between the methods 200 and 300. Embodiments of the invention may have more or fewer activities than those shown in FIG. 2 and FIG. 3.

FIG. 4 is a map 400 of memory cells in the arrays 146 of memory cells according to an embodiment of the invention that will be used to illustrate the activities of methods 200 and 300. Each memory cell in the map 400 has a number to identify it, and the map 400 includes memory cells 0-255. The map 400 is a square having 16 memory cells on each side. The map 400 is divided into 16 first groups 410 of the memory cells, each first group 410 having a square shape including 16 memory cells. The groups 410 may have other shapes.

Each of the memory cells 0-255 belongs to one of the first groups 410. For example, the memory cells 0-3, 16-19, 32-35, and 48-51 belong to the first group 410 in the lower left hand corner of the map 400. Each of the memory cells 0-255 belongs to one of 16 second groups of memory cells that overlays the first groups of memory cells. Each of the memory cells in one of the second groups of memory cells has the same position in its first group. In other words, memory cells with the same location in their first group of memory cells are included in a respective one of the second groups of memory cells. The second groups of memory cells are not given a reference character as the memory cells in each second group are distributed over the map 400. For example, the memory cells 0, 4, 8, 12, 64, 68, 72, 76, 128, 132, 136, 140, 192, 196, 200, and 204 are in the lower left hand corner of their respective first group 410 and therefore belong to a second group of the memory cells.

As shown in FIG. 4, each memory cell belongs to one of the first groups 410 of memory cells and one of the second groups of memory cells. Thus, the map 400 shows the memory cells arranged into groups of memory cells, each memory cell belonging to two of the groups of memory cells—the first group may comprise neighboring cells, and the second group may comprise cells having a similar locations in their respective first groups, as shown in FIG. 4. Other grouping arrangements are possible.

FIG. 5 is a map 500 of memory cells according to an embodiment of the invention that will be used to illustrate the activities of methods 200 and 300. The map 500 shows the memory cells 0-255 of FIG. 4 rearranged into rows 510 and columns 520 of memory cells. Each of the rows 510 includes memory cells found in one of the first groups 410 of memory cells shown in FIG. 4. Each of the columns 520 of memory cells includes memory cells found in one of the second groups of memory cells shown in FIG. 4. For example, the row 510 of memory cells at the bottom of the map 500 includes the memory cells 0-3, 16-19, 32-35, and 48-51 that belong to one of the first groups 410 shown in FIG. 4. The column 520 at the far left of the map 500 includes the memory cells 0, 4, 8, 12, 64, 68, 72, 76, 128, 132, 136, 140, 192, 196, 200, and 204 that belong to one of the second groups of memory cells shown in FIG. 4. The memory cells 0-255 are rearranged in FIG. 5 to better illustrate how a cross point cell is identified in the following discussion.

Figure 6:
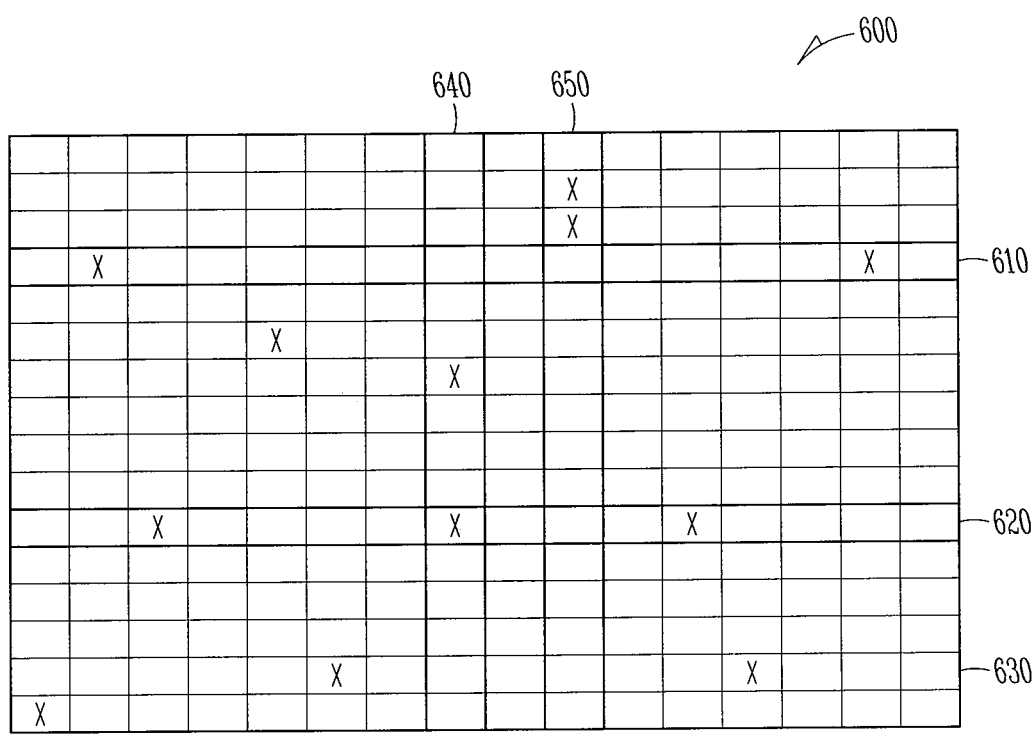
FIG. 6 is a map of memory cells according to an embodiment of the invention.

FIG. 6 is a map 600 of memory cells according to an embodiment of the invention that will be used to illustrate the activities of methods 200 and 300. The map 600 shows the memory cells 0-255 of FIG. 5 arranged in 16 rows and 16 columns, where each memory cell is shown as a box without a reference numeral. The data digits read from each row or each column are referred to as a word.

Some of the boxes contain an "x" to indicate that the memory cell is failing and will produce an erroneous data digit if read. When the failing data digits read from the memory cells in the map 600 are corrected according to Hamming codes, one error in a word is correctable while two or more errors in a word are not correctable. The map 600 shows that rows 610, 620, and 630 each contain two or more failing memory cells and data digits read from these rows are uncorrectable. In addition, columns 640 and 650 include two failing memory cells each and data digits read from these columns are uncorrectable. The failing memory cell in the row 620 and the column 640 is a cross point cell because the row 620 and the column 640 each have at least two failing memory cells.

Figure 7A:
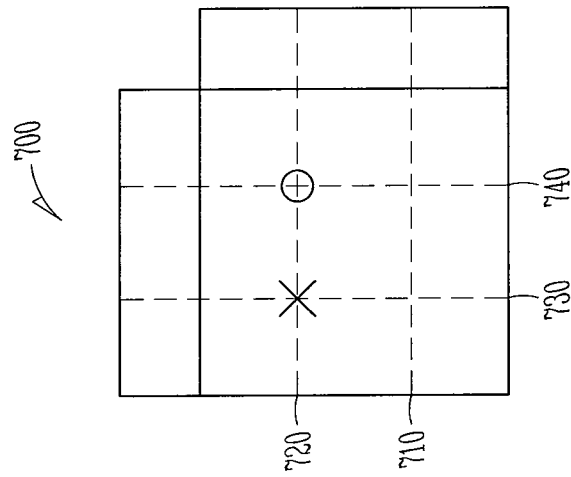
FIGS. 7A, 7B, and 7C are a map of memory cells according to an embodiment of the invention.
Figure 7B:
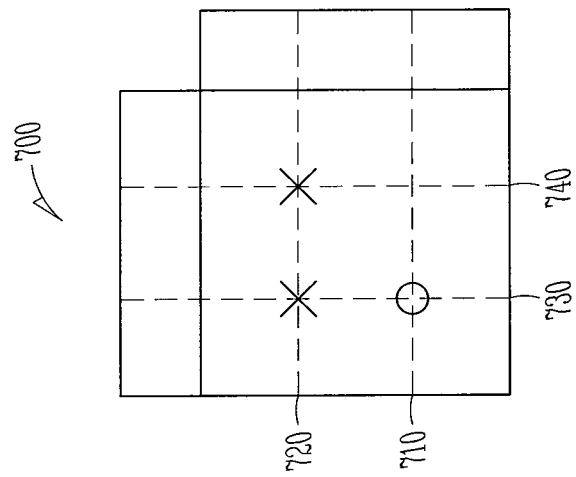
Figure 7C:
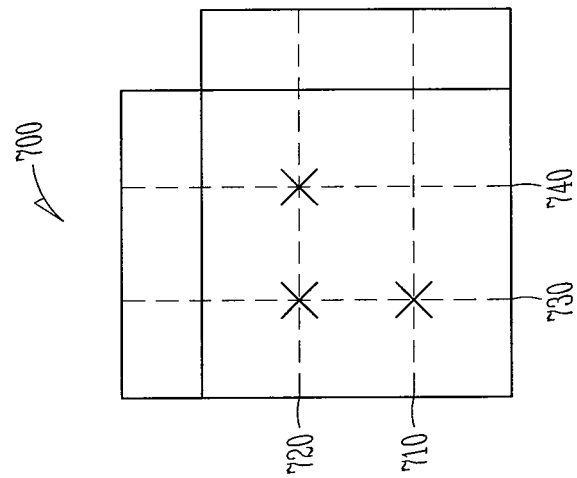

FIGS. 7A, 7B, and 7C are a map 700 of memory cells according to an embodiment of the invention that will be used to illustrate the activities of methods 200 and 300. The map 700 represents four memory cells arranged in two rows 710 and 720 and two columns 730 and 740 that are shown in successive stages of identifying a cross point cell according to an embodiment of the invention. The words read from the map 700 are corrected according to two Hamming codes that correct single errors in a word and identify uncorrectable words containing two or more errors. Some embodiments of the invention apply different error correcting codes that correct more than one error in individual words. Words read from the rows 710 and 720 are corrected according to a first Hamming code and words read from the columns 730 and 740 are corrected according to a second Hamming code.

FIG. 7A shows that both memory cells in column 730 are failing and that the memory cell in column 740 and row 720 is also failing. In a first activity the words read from the columns 730 and 740 are evaluated according to the second Hamming code, and the identity of uncorrectable words is stored. In this case, the word from the column 730 has two errors and is identified as uncorrectable and that information is stored.

The words from the rows 710 and 720 are then corrected according to the first Hamming code which corrects the digit read from the memory cell in the row 710 and column 730 that is shown corrected in FIG. 7B. The word from the row 720 cannot be corrected by the first Hamming code because it contains two errors.

Finally, the words from the columns are corrected by the second Hamming code, with the exception of the word in the column identified and stored as being the uncorrectable word. The digit read from the failing memory cell in the column 740 and the row 720 is therefore corrected by the second Hamming code as is shown in FIG. 7C. These activities leave a cross point digit in the column 730 and the row 720 also shown in FIG. 7C that is replaced with a repair memory cell.

Figure 8:
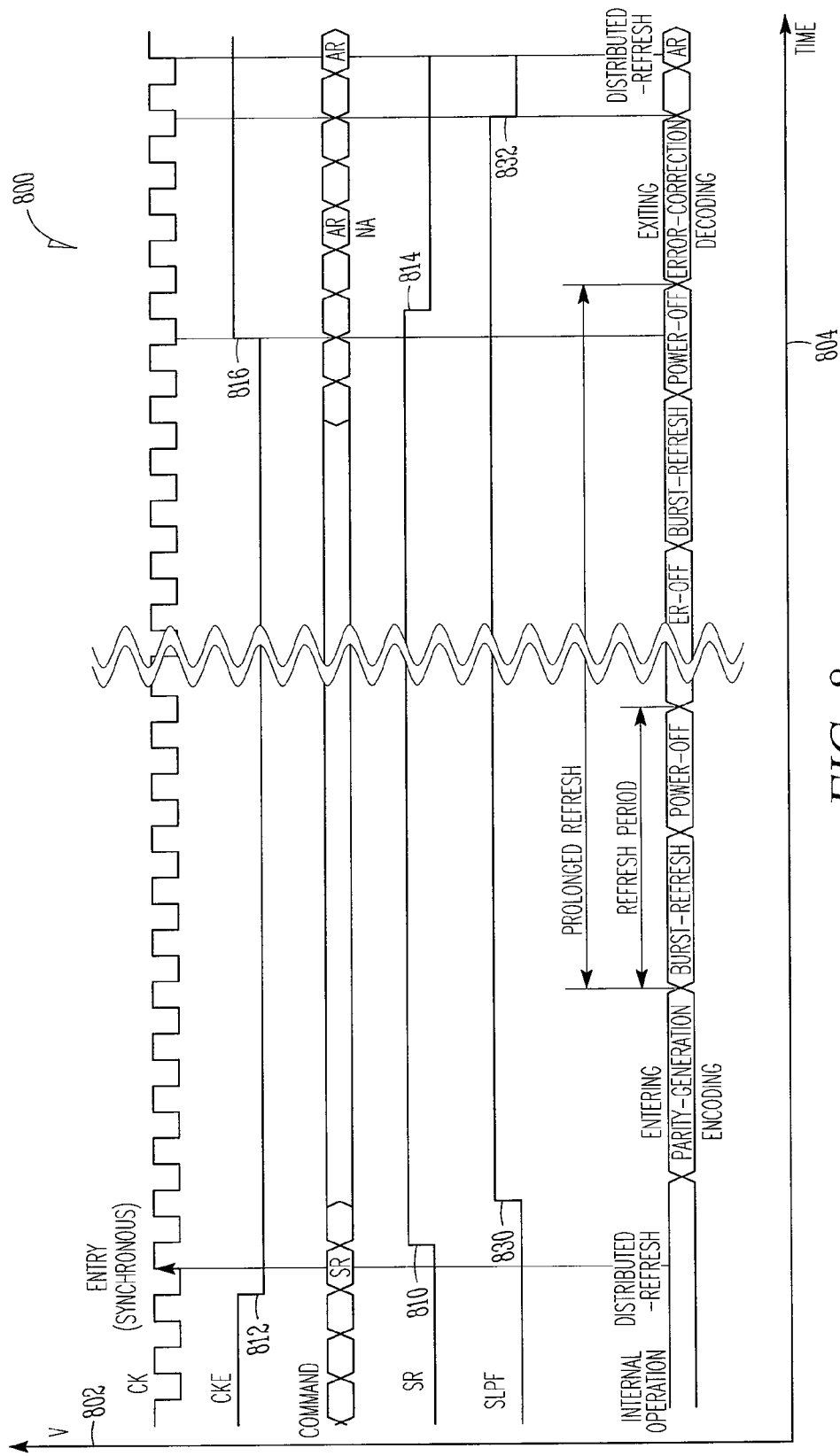
FIG. 8 is a timing chart of a memory device according to an embodiment of the invention.

FIG. 8 is a timing chart 800 of a memory device according to an embodiment of the invention. The timing chart 800 may govern the operation of the memory device 100 shown in FIG. 1. The timing chart 800 shows the timing of ECC-CODEC circuit operations shown in FIG. 9 and described below.

The timing chart 800 includes the signal SLPF generated by the state machine 158 shown in FIG. 1, the external clock signal CK, the clock enable signal CKE, and external commands received by the memory device 100 shown in FIG. 1, such as the SR command and the AR command. The SR signal is also shown in the timing chart 800. The signals are shown with reference to voltage on a vertical axis 802, and with reference to time on a horizontal axis 804.

A high WE/ signal combined with low CKE, CAS/, RAS/, and CS/ signals represents the SR command and the beginning of a sleep mode of operation. Thus, the SR signal goes high on a rising edge 810 following a falling edge 812 of the clock enable signal CKE to begin the sleep mode, and the SR signal goes low on a falling edge 814 following a rising edge 816 of the clock enable signal CKE to indicate the end of the sleep mode. The rising edge 816 of the clock enable signal CKE indicates the beginning of the AR command.

The signal SLPF rises on an edge 830 to begin a parity mode in which parity digits are generated as discussed below. The sleep mode begins with the parity mode which is followed by a prolonged refresh period including burst-refresh and power-off modes. Data digits stored in memory cells are refreshed during the burst-refresh modes.

The rising edge 816 of the clock enable signal CKE, the falling edge 814 of the SR signal, and the receipt of the external command AR indicate that the sleep mode is coming to an end, and a correction mode begins when data digits in the memory cells are corrected. When the correction mode is finished the signal SLPF falls on an edge 832 to indicate an end to the sleep mode.

Figure 9:
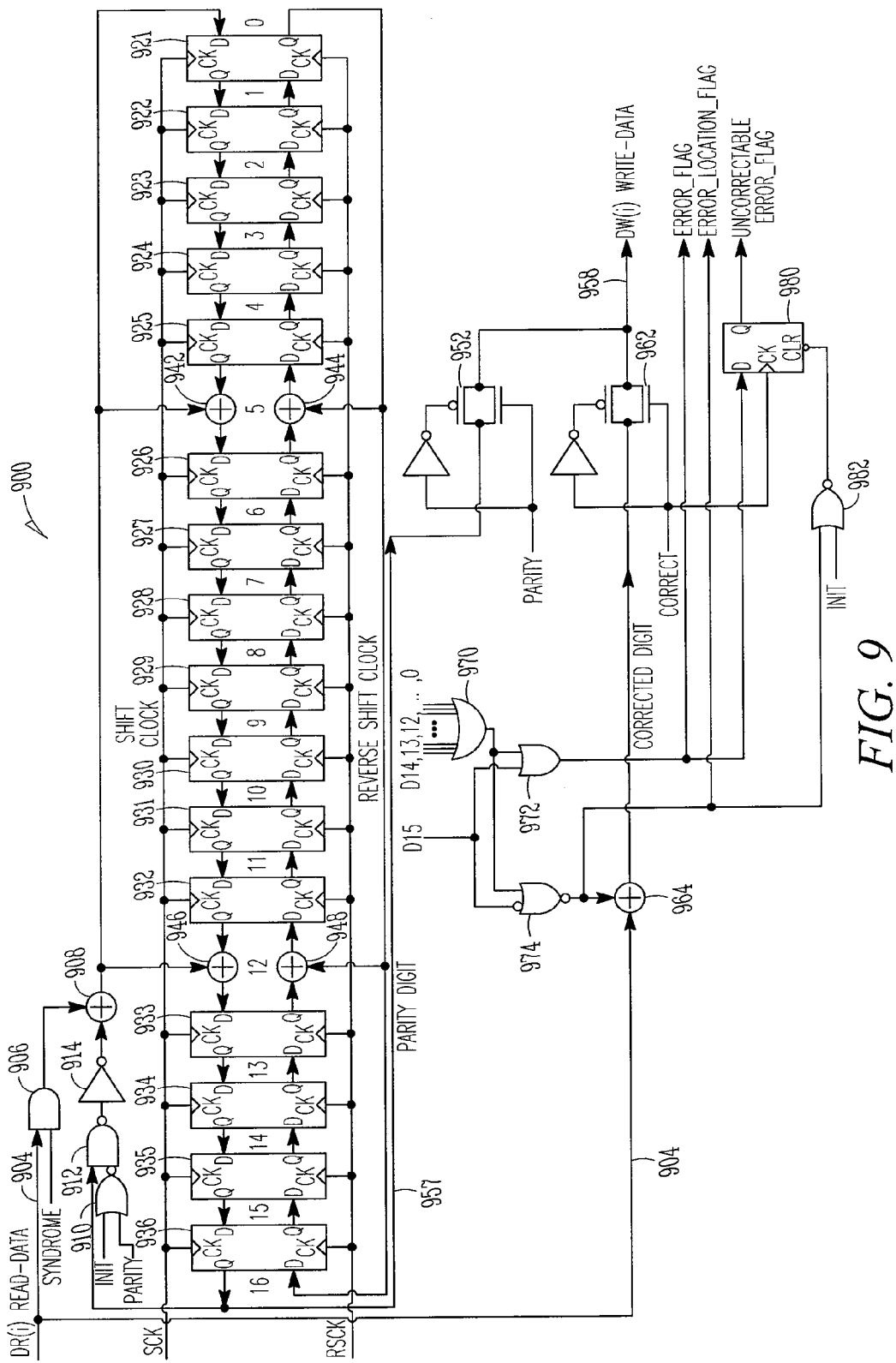
FIG. 9 is an electrical schematic diagram of an ECC-CODEC circuit according to an embodiment of the invention.

FIG. 9 is an electrical schematic diagram of an ECC-CODEC circuit 900 according to an embodiment of the invention. Each word read from an array of memory cells is corrected by a single ECC-CODEC circuit, and parity digits for the word are generated by the same ECC-CODEC circuit. The ECC-CODEC circuit 900 is operated in one of four modes, an initialization mode, a syndrome mode, a parity mode, and a correction mode that will be described below.

Serial data digits are received on a line 904. The data digits are coupled through a first input of an AND gate 906, and a second input of the AND gate 906 is coupled to receive a syndrome signal to control the AND gate 906. An output of the AND gate 906 is coupled to a first input of an exclusive-OR (XOR) gate 908, and an output of the XOR gate 908 is coupled to multiple locations in the ECC-CODEC circuit 900. The ECC-CODEC circuit 900 includes a shift register that has latches coupled in series with logic gates between selected latches. More particularly, the latches in the ECC-CODEC circuit 900 may comprise D-type flip flops with XOR gates between selected flip flops as described below.

An initialize signal and a parity signal are coupled to inputs of a not-OR (NOR) gate 910, and an output of the NOR gate 910 is coupled to a first input of a not-AND (NAND) gate 912. The parity signal has the profile of a clock signal. A second input of the NAND gate 912 is coupled to a Q output of the flip flops. An output of the NAND gate 912 is inverted by an inverter 914 and then coupled to a second input of the XOR gate 908.

Data digits from the output of the XOR gate 908 are coupled to multiple locations in a shift register 920 including a plurality of D-type flip flops 921, 922, 923, 924, 925, 926, 927, 928, 929, 930, 931, 932, 933, 934, 935, and 936 coupled in series. Each flip flop 921-936 includes a forward D input and Q output that are clocked by a shift-clock signal SCK. The forward direction begins in the flip flop 921 which represents a least significant digit in the shift register 920. The flip flop 936 represents a most significant digit in the shift register 920. Each flip flop 921-936 also includes a reverse D input and Q output that are clocked by a reverse shift-clock signal RSCK. The reverse direction begins in the flip flop 936 and ends in the flip flop 921.

Each flip flop 921-936 holds a single data digit that may be moved in the forward direction or the reverse direction. XOR gates 942 and 944 are coupled to insert data digits between the flip flops 925 and 926. XOR gates 946 and 948 are coupled to insert data digits between the flip flops 932 and 933. Data digits from the output of the XOR gate 908 are coupled to inputs of the XOR gates 942 and 946 as well as a D input of the flip flop 921. The data digits are subject to a logical operation in the shift register 920 depending on the mode of operation. In the case of a (48,32) code having a code length of 48 digits and 16 parity digits, operation of the ECC-CODEC circuit 900 is explained as follows.

The ECC-CODEC circuit 900 is operated in the initialization mode to reset all of the flip flops 921-936. The initialize signal coupled to the NOR gate 910 is enabled and data digits having a zero value are received from the output of the XOR gate 908 and coupled to the D input of the flip flop 921, as well as to the inputs of the XOR gates 942 and 946. SCK is clocked for 16 cycles, corresponding to the number of parity digits, so that each of the flip flops 921-936 holds a zero at its Q output.

The ECC-CODEC circuit 900 is operated in the syndrome mode to calculate parity digits or to generate a syndrome pattern. To calculate parity digits, the syndrome signal at the second input of the NAND gate 906 is enabled and data digits read from a memory device (read data digits) are received from the line 904 through the AND gate 906 and the XOR gate 908 and coupled to the D input of the flip flop 921 and the inputs of the XOR gates 942 and 946. SCK is clocked for 32 cycles, corresponding to the code length less the number of parity digits, after which 16 parity digits are stored in the flip flops 921-936. The parity digits are output from the flip flops 921-936 in the parity mode described below.

To generate a syndrome pattern, the syndrome signal at the second input of the NAND gate 906 is enabled and read data are received from the line 904 through the AND gate 906 and the XOR gate 908 and coupled to the D input of the flip flop 921 and the inputs of the XOR gates 942 and 946. SCK is clocked for 48 cycles, corresponding to the code length, after which 16 digits of the syndrome pattern are stored in the forward direction of the flip flops 921-936.

The syndrome pattern is used to indicate an error in the read data digits. If the digits of the syndrome pattern are all zero, the read data has no error. If the digits of the syndrome pattern are not all zero, the read data has one or more errors, and an error flag is activated as will be described below.

The ECC-CODEC circuit 900 is operated in the parity mode to output the parity digits from the flip flops 921-936. The parity signal is enabled and received by the second input of the NOR gate 910 and a pass gate 952 such that the pass gate 952 conducts parity digits on a line 957 from the Q output of the flip flop 936 to a write data line 958. SCK is clocked for 16 cycles, corresponding to the number of parity digits, until all of the parity digits have been output through the pass gate 952 to the write data line 958. Also, the flip flops 921-936 are reset by digits having a value of zero that are coupled to the D input of the flip flop 921 while SCK is being clocked. The parity digits are stored the parity areas of memory cells in each array 146 in the memory device 100.

The ECC-CODEC circuit 900 is operated in the correction mode to detect the location of errors in a word read from a memory device. Operation of the correction mode follows the syndrome mode, leaving the syndrome pattern in the flip flops 921-936. At the end of the syndrome mode, a correct signal, which has the profile of a clock signal, is enabled to switch on a pass gate 962 to couple corrected digits to the write data line 958. Read data are received on the line 904 coupled to a first input of an XOR gate 964. A second input of the XOR gate 964 is coupled to an output of error logic 966 that generates an error flag and an error location flag from the syndrome pattern. The error logic 966 includes an OR gate 970 coupled to receive at its multiple inputs the D inputs of the flip flops 921-935 which includes all but the last flip flop 936. An output of the OR gate 970 is coupled to first inputs of an OR gate 972 and a NOR gate 974. A second input of the OR gate 972 is coupled to the D input of the last flip flop 936, and this digit is received by an inverting input of the NOR gate 974. An output of the OR gate 972 generates the error flag indicating the presence of an error in the read data, and an output of the NOR gate 974 generates an error location flag that is coupled to a second input of the XOR gate 964.

A reverse shift operation is carried out by clocking a reverse shift clock (RSCK) for 48 cycles, corresponding to the code length, to alter the syndrome pattern stored in the flip flops 921-936. The modified syndrome pattern stored in the flip flops 921-936 is used to indicate the location of the error in the read data. The read data received from the line 904 is corrected in the XOR gate 964 by the error location flag generated by the NOR gate 974, and corrected digits are generated at an output of the XOR gate 964 and coupled through the pass gate 962 to the write data line 958.

A latch 980 is a D-type flip flop having a clock input coupled to receive the correct signal and a D input coupled to receive the error flag. The latch 980 is coupled to receive the error flag from the OR gate 972. When there is more than one error in the word in the ECC-CODEC circuit 900, the latch 980 is coupled to receive a second error flag to latch a high value indicating uncorrectable errors in the word. A Q output of the latch 980 is cleared to zero by the initialize signal that is coupled through a NOR gate 982 along with the error location flag to a CLR input in the latch 980.

A single error identified in the word in the shift register 920 during the correction mode results in a single high error flag that rests at the D input of the latch 980. If a second error is identified in the word during the correction mode, a second high error flag sets a high signal at the Q output of the latch 980 as an uncorrectable error flag to indicate that the word in the shift register 920 has uncorrectable errors. The latch 980 thus identifies the word in the shift register 920 as uncorrectable and stores that information to implement the methods described herein.

The ECC-CODEC circuit 900 has been described as implementing a Hamming code, and in particular the (48,32) code, to identify and correct errors. A modified ECC-CODEC circuit can implement codes of different lengths including longer code lengths. A modified ECC-CODEC circuit can implement other error correction codes that are capable of correcting two or more errors in a single word according to some embodiments of the invention. Such an ECC-CODEC circuit would include two or more latches in place of the latch 980 to indicate an uncorrectable word. Thus, the circuits and methods shown and described herein according to embodiments of the invention may implement error correction codes other than the Hamming code such as a Reed-Solomon code, a BCH code, a binary Golay code, a ternary Golay code, a Reed-Muller code, a turbo code, or a LDPC code.

An advantage of the circuits and methods shown and described herein according to some embodiments of the invention is that, when a memory device includes four adjacent memory cells that are failing, a replacement of only one of the four failing memory cells with a repair memory cell allow data digits from the remaining three failing memory cells to be corrected by application of Hamming codes.

The methods shown and described herein may be implemented during a testing procedure when the memory device 100 is stressed beyond what is expected in normal operation causing memory cells to fail that would not fail in normal operation. The memory device 100 may be stressed until each available repair memory cell is used to replace a memory cell in the memory device 100.

Figure 10:
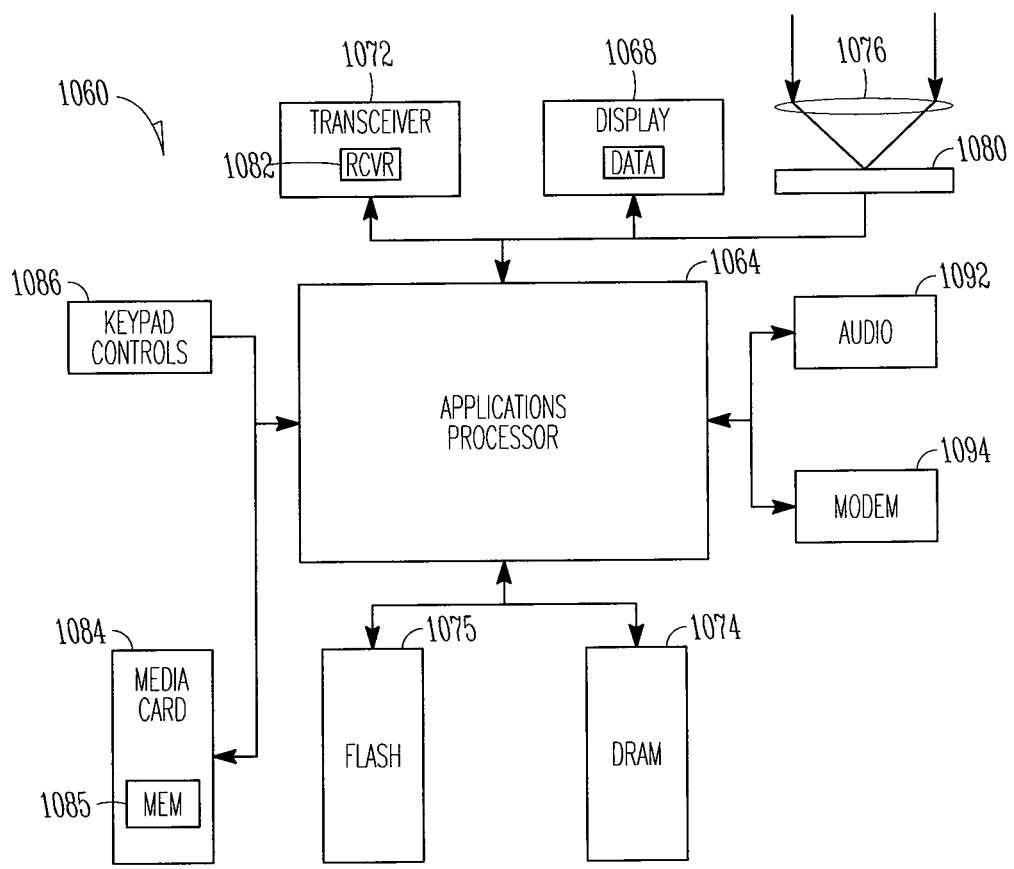
FIG. 10 is a block diagram of a system according to an embodiment of the invention.

FIG. 10 is a block diagram of a system 1060 according to an embodiment of the invention. The system 1060, in some embodiments, may include a processor 1064 coupled to a display 1068 and/or a wireless transceiver 1072. The display 1068 may be used to display data, perhaps received by the wireless transceiver 1072. The system 1060, in some embodiments, may include a memory device such as a dynamic random access memory (DRAM) 1074 and/or a Flash memory 1075. The processor 1064 is coupled to exchange data with the DRAM 1074 and the Flash memory 1075. The DRAM 1074 may be a synchronous DRAM (SDRAM).

In some embodiments, the system 1060 may include a camera including a lens 1076 and an imaging plane 1080 to couple to the processor 1064. The imaging plane 1080 may be used to receive light captured by the lens 1076.

Many variations are possible. For example, in some embodiments, the system 1060 may include a cellular telephone receiver 1082 forming a portion of the wireless transceiver 1072. The cellular telephone receiver 1082 may also receive data to be processed by the processor 1064, and displayed on the display 1068. In some embodiments, the system 1060 may include an audio, video, or multi-media player 1084, including a memory device 1085 and a set of media playback controls 1086 to couple to the processor 1064. The processor 1064 may also be coupled to exchange data with an audio device 1092 and/or a modem 1094.

Any of the memory devices of the system 1060 including the DRAM 1074, the Flash memory 1075, and the memory device 1085 may be operated according to the methods and include the circuits according to embodiments of the invention shown and described herein. Any of the circuits or systems described herein may be referred to as a module. A module may comprise a circuit and/or firmware according to embodiments of the invention.

The novel apparatus and systems of various embodiments may include and/or be included in electronic circuitry used in high-speed computers, communication and signal processing circuitry, single or multi-processor modules, single or multiple embedded processors, multi-core processors, data switches, and application-specific modules including multilayer, multi-chip modules. Such apparatus and systems may further be included as sub-components within a variety of electronic systems, such as televisions, cellular telephones, personal computers (e.g., laptop computers, desktop computers, handheld computers, tablet computers, etc.), workstations, radios, video players, audio players (e.g., MP3 (Motion Picture Experts Group, Audio Layer 3) players), vehicles, medical devices (e.g., heart monitor, blood pressure monitor, etc.), set top boxes, and others. Some embodiments may include a number of methods, as described above.

The accompanying drawings that form a part hereof show, by way of illustration and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims and the full range of equivalents to which such claims are entitled.

Such embodiments of the inventive subject matter may be referred to herein individually or collectively by the term "invention" merely for convenience and without intending to voluntarily limit the scope of this application to any single invention or inventive concept, if more than one is in fact disclosed. Thus, although specific embodiments have been illustrated and described herein, any arrangement calculated to achieve the same purpose may be substituted for the specific embodiments shown. This disclosure is intended to cover any and all adaptations or variations of various embodiments. Combinations of the above embodiments and other embodiments not specifically described herein will be apparent to those of skill in the art upon reviewing the above description.

The Abstract of the Disclosure is provided to comply with 37 C.F.R. §1.72(b) requiring an abstract that will allow the reader to quickly ascertain the nature of the technical disclosure. It is submitted with the understanding that it will not be used to interpret or limit the scope or meaning of the claims. In the foregoing Detailed Description, various features are grouped together in a single embodiment for the purpose of streamlining the disclosure. This method of disclosure is not to be interpreted to require more features than are expressly recited in each claim. Rather, inventive subject matter may be found in less than all features of a single disclosed embodiment. Thus the following claims are hereby incorporated into the Detailed Description, with each claim standing on its own as a separate embodiment.

What is claimed is:

1. A method for repairing a memory device, wherein the memory device includes a plurality of memory cells to store binary data digits, each of the plurality of memory cells belonging to at least a first group and a second group, the method comprising:
   identifying memory cells in the memory device that fail as failing memory cells;
   identifying when a selected one of the failing memory cells belongs to both the first group including two failing memory cells and the second group including two failing memory cell;
   replacing the selected one of the failing memory cells with a repair memory cell when the selected one of the failing memory cells belongs to both the first group and the second group; and
   correcting binary data digits read from a plurality of the failing memory cells other than the selected one of the failing memory cells according to an error correction code.

2. The method of claim 1, wherein replacing a selected one of the failing memory cells with a repair memory cell includes:
   designating the repair memory cell to receive each data digit that is to be written to the selected one of the failing memory cells; and
   reading the repair memory cell to retrieve a data digit that was to have been read from the selected one of the failing memory cells.

3. The method of claim 1, further comprising selecting the error correction code from the group consisting of a Hamming code, a Reed-Solomon code, a BCH code, a binary Golay code, a ternary Golay code, a Reed-Muller code, a turbo code, and an LDPC code.

4. A method comprising:
   reading a plurality of binary data digits from a plurality of memory cells in a memory device, each of the memory cells to store at least one binary data digit;
   reading a binary data digit from a repair memory cell to replace a binary data digit from a cross point cell, the cross point cell being one of the plurality of memory cells that is a failing memory cell;

identifying when the cross point cell as belonging to a first group of the memory cells including two failing memory cells and belonging to a second group of the memory cells including two failing memory cells, wherein each of the plurality of memory cells in the memory device belongs to one of a plurality of first groups of the memory cells and one of a plurality of second groups of the memory cells;

replacing the cross point cell when it belongs to both the first group of memory cells and the second group of memory cells; and correcting a plurality of the binary data digits read from the plurality of memory cells, other than the cross point cell, according to an error correction code.

5. The method of claim 4, further comprising:

identifying one or more errors in binary data digits read from memory cells in the first groups according to first error correction codes; and identifying one or more errors in binary data digits read from memory cells in the second groups according to second error correction codes.

6. The method of claim 5, wherein correcting a plurality of the binary data digits read from the plurality of memory cells further comprises:

correcting errors in the binary data digits read from memory cells in the first groups according to the first error correction codes; and correcting errors in the binary data digits read from memory cells in the second groups according to the second error correction codes.

7. The method of claim 4, wherein correcting a plurality of the binary data digits further comprises correcting the plurality of the binary data digits read from the plurality of memory cells according to a Hamming code.

8. A method for testing a memory device, wherein the memory device includes a plurality of memory cells and a plurality of repair memory cells, and wherein each of the plurality of memory cells belongs to one of a plurality of first blocks of memory cells and one of a plurality of second blocks of memory cells, the method comprising:

storing binary data digits in the plurality of memory cells;

stressing the memory device beyond what is expected in a normal operation causing one or more of the plurality of memory cells to fail that would not fail in the normal operation;

identifying memory cells in the plurality of memory cells that fail as cross point cells when each block including one of the cross point cells includes two memory cells that fail; and replacing each of the cross point cells with one of the repair memory cells.

9. The method of claim 8, further comprising stressing the memory device until each of the plurality of repair memory cells is used to replace a cross point cell in the memory device.

10. The method of claim 8, wherein identifying memory cells in the plurality of memory cells that fail as cross point cells further comprises:

identifying memory cells that fail in each first block according to a first error correction code; and identifying memory cells that fail in each second block according to a second error correction code.

11. The method of claim 10, wherein:

the first error correction code comprises a first Hamming code; and the second error correction code comprises a second Hamming code.

12. The method of claim 10, further comprising selecting the first error correction code and the second error correction code from the group consisting of a Reed-Solomon code, a BCH code, a binary Golay code, a ternary Golay code, a Reed-Muller code, a turbo code, and a LDPC code.

13. An apparatus, comprising:

an array of memory cells, each of the memory cells to store at least one binary data digit and each of the memory cells belonging to at least a first group and a second group;

a plurality of repair memory cells; and a control circuit configured to identify failing memory cells in the array of memory cells, identify when the failing memory cells belong to both the first group including at least two failing memory cells and the second group including at least two failing memory cells;

correct binary data digits read from a subset of the failing memory cells according to error correction codes, and replace each of the failing memory cells having a binary data digit that was not corrected according to the error correction codes with one of the repair memory cells when the failing memory cells belong to both the first group and the second group.

14. The apparatus of claim 13, further comprising:

storage, wherein the control circuit is configured to store an identity of each of the failing memory cells having a binary data digit that was not corrected according to the error correction codes and the repair memory cell that replaced each of the failing memory cells.

15. The apparatus of claim 13, wherein the control circuit comprises:

a plurality of error correcting code (ECC)-encoder/decoder (CODEC) circuits, at least some of the ECC-CODEC circuits being configured to identify and correct errors in binary data digits read from the subset of the failing memory cells.

16. The apparatus of claim 15, wherein at least some of the ECC-CODEC circuits comprise:

a shift register; and a latch to latch information identifying binary data digits in the shift register as an uncorrectable word.

17. The apparatus of claim 13, wherein the apparatus comprises a system.

18. The apparatus of claim 13, wherein the apparatus comprises a memory device.

19. A memory device, comprising:

an array of memory cells, each memory cell configured to store a binary data digit; and a control circuit configured to organize the array of memory cells into a plurality of first groups of memory cells and a plurality of second groups of memory cells, each of the array of memory cells belonging to one of the first groups and one of the second groups;

identify a cross point cell as a failing memory cell that belongs to one of the first groups of memory cells including two failing memory cells and one of the second groups of memory cells including two failing memory cells;

read a plurality of binary data digits from the memory cells, read a binary data digit from a repair memory cell to replace a binary data digit from the cross point cell, and correct a plurality of the binary data digits read from the array of memory cells according to an error correction code.

20. The apparatus of claim 19, wherein the control circuit is configured to:

identify memory cells that fail in each of the first groups according to a first error correction code; and identify memory cells that fail in each of the second groups according to a second error correction code.

21. The apparatus of claim 19, wherein the control circuit is configured to correct a plurality of the data digits read from the memory cells according to an error correction code selected the from the group consisting of a Hamming code, a Reed-Solomon code, a BCH code, a binary Golay code, a ternary Golay code, a Reed-Muller code, a turbo code, and a LDPC code.

22. The apparatus of claim 19, wherein the memory device comprises a dynamic random access memory.

23. The apparatus of claim 19, wherein the memory device comprises a flash memory.

* * * * *

UNITED STATES PATENT AND TRADEMARK OFFICE
CERTIFICATE OF CORRECTION

| | |
|---|---|
| PATENT NO. | : 8,694,861 B2 |
| APPLICATION NO. | : 13/593217 |
| DATED | : April 8, 2014 |
| INVENTOR(S) | : Yutaka Ito et al. |

Page 1 of 1

It is certified that error appears in the above-identified patent and that said Letters Patent is hereby corrected as shown below:

In the Claims

In column 11, line 18, in claim 5, delete "claim 4,further" and insert -- claim 4, further --, therefor.

Signed and Sealed this
Twenty-second Day of July, 2014

Michelle K. Lee
*Deputy Director of the United States Patent and Trademark Office*

UNITED STATES PATENT AND TRADEMARK OFFICE
CERTIFICATE OF CORRECTION

PATENT NO. : 8,694,861 B2
APPLICATION NO. : 13/593217
DATED : April 8, 2014
INVENTOR(S) : Yutaka Ito et al.

Page 1 of 1

It is certified that error appears in the above-identified patent and that said Letters Patent is hereby corrected as shown below:

In the Claims

Column 13, line 7, claim 20, delete "apparatus" and insert -- memory device --, therefor.
Column 13, line 13, claim 21, delete "apparatus" and insert -- memory device --, therefor.
Column 13, line 20, claim 22, delete "apparatus" and insert -- memory device --, therefor.
Column 13, line 22, claim 23, delete "apparatus" and insert -- memory device --, therefor.

Signed and Sealed this
Ninth Day of December, 2014

Michelle K. Lee
*Deputy Director of the United States Patent and Trademark Office*